United States Patent
Mori et al.

(10) Patent No.: US 10,876,977 B2
(45) Date of Patent: Dec. 29, 2020

(54) INSPECTION MANAGEMENT SYSTEM, INSPECTION MANAGEMENT APPARATUSES, AND INSPECTION MANAGEMENT METHOD

(71) Applicant: OMRON Corporation, Kyoto (JP)

(72) Inventors: Hiroyuki Mori, Ono (JP); Katsuki Nakajima, Kyoto (JP); Mayuko Tanaka, Kyoto (JP); Takako Onishi, Kyotanabe (JP); Isao Nakanishi, Muko (JP)

(73) Assignee: OMRON Corporation, Kyoto (JP)

( * ) Notice: Subject to any disclaimer, the term of this patent is extended or adjusted under 35 U.S.C. 154(b) by 318 days.

(21) Appl. No.: 16/162,409

(22) Filed: Oct. 17, 2018

(65) Prior Publication Data

US 2019/0219521 A1    Jul. 18, 2019

(30) Foreign Application Priority Data

Jan. 16, 2018 (JP) ................ 2018-005173

(51) Int. Cl.
*G01N 21/956* (2006.01)
*G05B 19/418* (2006.01)
(Continued)

(52) U.S. Cl.
CPC .......... *G01N 21/956* (2013.01); *G01B 11/24* (2013.01); *G01N 21/93* (2013.01); *G01N 23/04* (2013.01);
(Continued)

(58) Field of Classification Search
CPC ...... G01N 21/956; G01N 21/93; G01N 23/04; G01N 2021/95638; G05B 19/41875;
(Continued)

(56) References Cited

U.S. PATENT DOCUMENTS 8,224,605 B2 * 7/2012 Tasaki ................. H05K 13/083
                                                    702/83
2004/0225384 A1   11/2004 Onishi et al.
(Continued)

FOREIGN PATENT DOCUMENTS

DE    112011104725    7/2016
JP    H0950949        2/1997
(Continued)

OTHER PUBLICATIONS

"Search Report of Europe Counterpart Application", dated Mar. 25, 2019, p. 1-p. 10.

*Primary Examiner* — Mischita L Henson
(74) *Attorney, Agent, or Firm* — JCIPRNET

(57) ABSTRACT

An inspection management system that manages inspection of an inspection apparatus in a production line including a manufacturing apparatus of a product and the inspection apparatus includes: an acquisition unit configured to acquire inspection content data including an inspection standard for each component; an inspection content setting unit configured to set inspection content; a setting-related information acquisition unit configured to acquire setting-related information including at least a time at which new inspection content is set when the inspection content setting unit sets the new inspection content; a storage unit configured to retain the setting-related information in association with a history of the setting of the inspection content; a setting-related information reading unit configured to read the setting-related information retained in the storage unit; and an output unit configured to be able to output the setting-related information.

20 Claims, 8 Drawing Sheets

(51) Int. Cl.
*H05K 13/08* (2006.01)
*G01B 11/24* (2006.01)
*G01N 21/93* (2006.01)
*G01N 23/04* (2018.01)

(52) U.S. Cl.
CPC ..... *G05B 19/41875* (2013.01); *H05K 13/083* (2018.08); *G01N 2021/95638* (2013.01); *G05B 2219/32186* (2013.01); *G05B 2219/32196* (2013.01); *G05B 2219/32197* (2013.01)

(58) Field of Classification Search
CPC ........... G05B 2219/32196; G05B 2219/32186; G05B 2219/32197; G05B 2219/32368; H05K 13/083; G01B 11/24; Y02P 90/02
See application file for complete search history.

(56) References Cited

U.S. PATENT DOCUMENTS

| | | |
|---|---|---|
| 2006/0271226 A1 | 11/2006 | Tasaki et al. |
| 2012/0185221 A1 | 7/2012 | Mori et al. |

FOREIGN PATENT DOCUMENTS

| | | | | |
|---|---|---|---|---|
| JP | 2008032525 | | 2/2008 | |
| JP | 2013134560 A | * | 7/2013 | ........... G05B 19/418 |
| JP | 5522065 B2 | * | 6/2014 | ......... H05K 13/0815 |

* cited by examiner

FIG. 3

| Board No. | Detection result after reflow | Post-printing inspection | Post-mounting inspection | Post-reflow inspection |
|---|---|---|---|---|
| 1 | NG | NG | OK | NG(Detected after printing) |
| 2 | NG | NG | OK | NG(Detected after printing) |
| 3 | NG | NG | OK | NG(Detected after printing) |
| 4 | NG | OK | OK | NG |
| 5 | NG | OK | OK | NG |
| 6 | NG | OK | OK | NG |
| 7 | NG | OK | OK | NG |
| 8~100 | 93 pieces OK | 7 pieces NG 86 pieces OK | 2 pieces NG 91 pieces OK | OK |
| Defective detection number | — | 3 | 0 | 4 |
| First pass ratio | — | 86/93=92.5% | 91/93=97.8 | — |

| Board No. | Detection result after reflow | Post-printing inspection | Post-mounting inspection | Post-reflow inspection |
|---|---|---|---|---|
| 1 | NG | NG | OK | NG(Detected after printing) |
| 2 | NG | NG | NG(Detected after printing) | NG(Detected after printing) |
| 3 | NG | NG | OK | NG(Detected after printing) |
| 4 | NG | OK | NG | NG(Detected after mounting) |
| 5 | NG | OK | OK | NG |
| 6 | NG | OK | OK | NG |
| 7 | NG | OK | OK | NG |
| 8~100 | 93 pieces OK | 1 piece NG 92 pieces OK | 93 pieces OK | OK |
| Defective detection number | — | 3 | 1 | 3 |
| First pass ratio | — | 92/93=98.9% | 93/93=100.0 | — |

FIG. 7

INSPECTION MANAGEMENT SYSTEM, INSPECTION MANAGEMENT APPARATUSES, AND INSPECTION MANAGEMENT METHOD

CROSS-REFERENCE TO RELATED APPLICATION

This application claims the priority of Japan patent application serial no. 2018-005173, filed on Jan. 16, 2018. The entirety of the above-mentioned patent application is hereby incorporated by reference herein and made a part of this specification.

BACKGROUND

Technical Field

The disclosure relates to a technology for performing inspection of a product in a product production line.

Description of Related Art

In product production lines, inspection apparatuses of the products are disposed in intermediate processes or final processes of the lines to detect defects or sort out defective products. For example, a production line of a component mounting board generally includes a process (printing process) of printing solder cream on a printed wiring board, a step (mounting process) of mounting components on the board on which the solder cream is printed, and a process (reflow process) of heating the board after the component-mounting and soldering components on the board, and inspection is performed after each step.

In this inspection, it is necessary to set inspection standards for determining good-quality or defect and keep the inspection standards in a state that the inspection apparatuses can be referred to. For example, in the foregoing component mounting board, an inspection standard is normally set and maintained for each part number of a component. Here, when the inspection standards to be set are not appropriate, "excessive-looking" in which an actually good-quality product is determined to be a defective product occurs and "overlooking" in which an actually defective product is determined to be a good-quality product may occur.

"Excessive-looking" results in deterioration in inspection efficiency, such as deterioration in a yield or an increase in re-inspection cost. On the other hand, "overlooking" results in deterioration in work efficiency in subsequent processes, such as occurrence of repair work, or shipment of defective products. Therefore, it is preferable to minimize both "excessive-looking" and "overlooking." However, when the inspection standards are stricter to reduce "overlooking," "excessive-looking" increases. When the inspection standards are loose to decrease "excessive-looking," "overlooking" increases. Therefore, it is necessary to set appropriate inspection standards.

For setting of the inspection standards, an invention devised to reduce a burden on a user is disclosed. For example, Patent Document 1 (Japanese Patent Application Laid-open No. 2008-32525) discloses the following method of setting inspection standards. That is, in an exterior inspection apparatus of a component mounting board, for each setting target component of inspection standard data, a relation between colors of the component and a board or a combination between exterior information indicating a feature of the color near the component on an image and inspection standard data suitable for the exterior information is registered in advance in a plurality of patterns. A good-quality product image of a processing target component is displayed on a screen and options for the exterior information registered for the processing target component are displayed on the same screen. When a user performs a selection operation, the inspection standard data corresponding to the selected option is read.

By adopting the foregoing method, even a user who lacks a knowledge or an experience in setting of an inspection standard can easily set the inspection standard, but may not perform setting in which so-called "excessive-looking" is suppressed.

The setting of the inspection standard is performed at the time of launch of an inspection apparatus and is also performed as a change (correction) in a standard, for example, when a part number of a component to be mounted is changed or when there is a difference that has an influence on the inspection standard in accordance with a difference in a manufactured lot even in the same part number. For example, although there is no difference in an actual inspection target in the exterior inspection apparatus, an inspection image acquired in accordance with a change in an inspection environment such as deterioration of a light source is different from that in the start of setting of the inspection standard and a good-quality product is determined to be a defective product in some cases. In these cases, countermeasures can be taken by changing the inspection standard in haste rather than returning an original environment in some cases.

From this viewpoint, the inspection standard for the inspection apparatus is set (changed) extemporaneously by a person who has not a corresponding authority or ability.

In this foregoing circumstance, for example, when "excessive-looking" occurs many times, the inspection standard readily becomes too loose or execution of inspection is cancelled, and thus a problem that a defect passing to a subsequent process or a customer occurs. When "overlooking" occurs, the inspection standard may be set excessively strictly, and thus a problem that production efficiency considerably deteriorates also occurs. When such a problem occurs, information regarding a person who sets (changes) the inspection standard, a time at which the inspection standard is set (changed), and a viewpoint or intention with which the inspection standard is set (changed) is checked to take countermeasures. However, in the technology of the related art, it is difficult to check such information.

When a defective product is found in a subsequent process or after shipment, it is necessary to check the setting at the time of overlooking of the defective product and check which is a standard causing "overlooking," why the inspection is performed using the inspection standard, or when a period in which the inspection is performed using the standard comes (for example, for convenience for a customer). In a current state, there is a problem that it is difficult to check such information.

SUMMARY

An aspect of the disclosure is to provide an inspection management system that manages inspection of an inspection apparatus in a production line including a manufacturing apparatus of a product and the inspection apparatus inspecting the product manufactured by the manufacturing apparatus. The inspection management system includes: an inspection content data acquisition unit configured to acquire inspection content data including an inspection standard for each inspection item of the product; an inspection content setting unit configured to set inspection content based on the inspection content data acquired by the inspection content data acquisition unit; a setting-related information acquisition unit configured to acquire setting-related information including at least a time at which new inspection content is set when the new inspection content is set by the inspection content setting unit; a storage unit configured to retain the setting-related information acquired by the setting-related information acquisition unit in association with a history of the setting of the inspection content; a setting-related information reading unit configured to read the setting-related information retained in the storage unit; and an output unit configured to output at least the setting-related information read by a setting-related information reading unit.

According to an aspect of the disclosure, an inspection apparatus is included in the above-described inspection management system and includes: the inspection content data acquisition unit; the inspection content setting unit; the setting-related information acquisition unit; the storage unit; the setting-related information reading unit; and the output unit.

An aspect of the disclosure is to provide an inspection management method of managing inspection of an inspection apparatus in a production line including a manufacturing apparatus of a product and the inspection apparatus inspecting the product manufactured by the manufacturing apparatus. The inspection management method includes: a first step of checking an inspection situation by the inspection apparatus; a second step of determining whether inspection content is appropriate based on the inspection situation checked in the first step; a third step of calculating an appropriate inspection content when it is determined in the second step that the inspection content is not appropriate; a fourth step of presenting the appropriate inspection content calculated in the third step to a user along with base information indicating that the inspection content is appropriate; a fifth step of receiving an approval from the user for performing the inspection in accordance with the inspection content presented in the fourth step; a sixth step of setting the inspection content by the inspection apparatus to new inspection content when the approval is received from the user in the fifth step; and a seventh step of storing data of the new inspection content as history information along with setting-related information including a time at which at least the new inspection content is set when the new inspection content is set in the sixth step.

BRIEF DESCRIPTION OF THE DRAWINGS

FIG. 3 is a diagram illustrating a display example of setting-related information according to the application example.

FIG. 7 is a diagram for describing a defect detection number and a first pass ratio.

DESCRIPTION OF THE EMBODIMENTS

Figure 1:
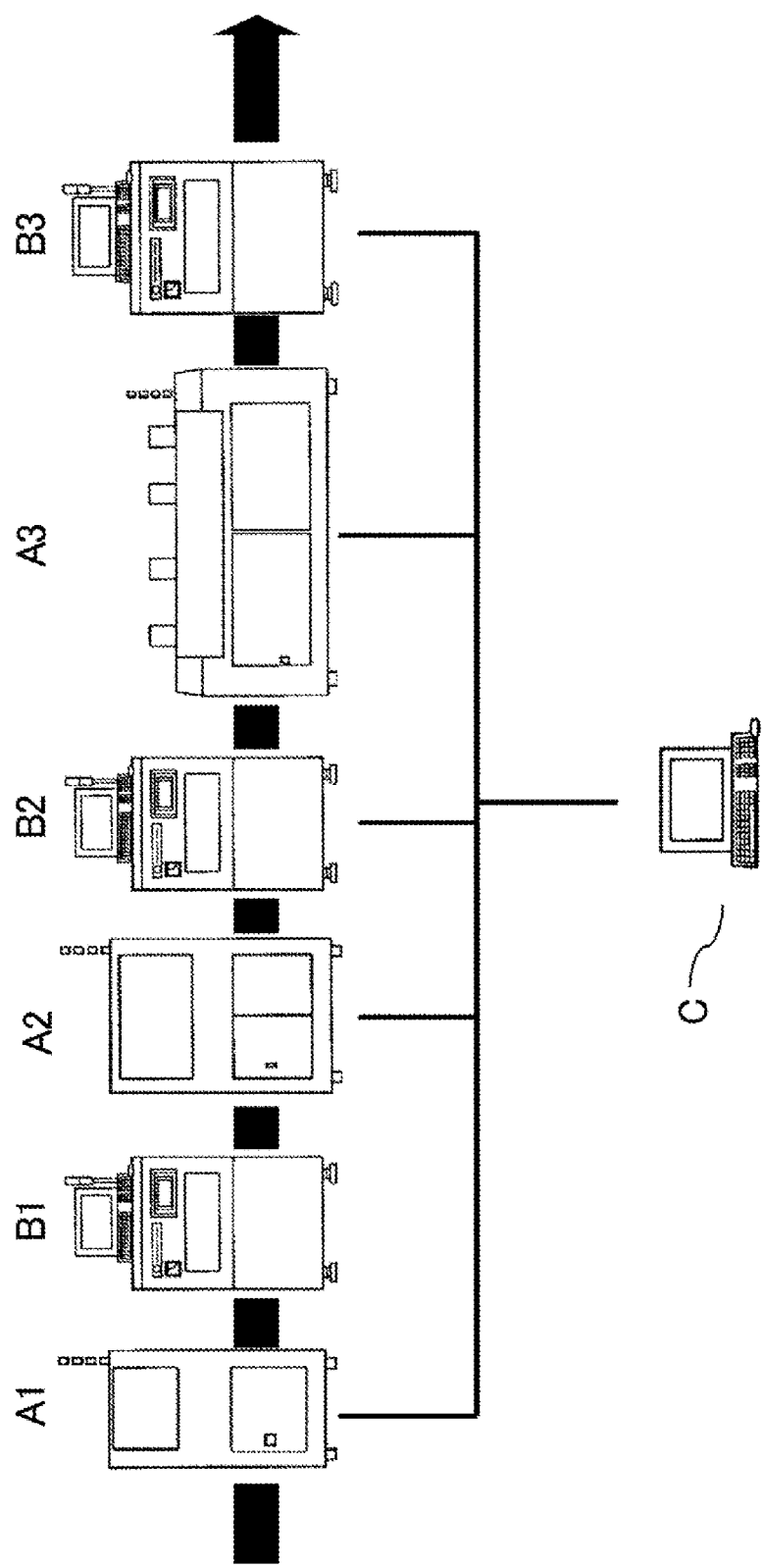
FIG. 1 is a diagram illustrating a configuration of a production line and an inspection management system according to an application example.

The invention is devised in view of the foregoing circumstances and the embodiments of the disclosure is to provide a technology for retaining information related to setting (including a change) of disclosure content in an inspection apparatus as a history and enabling the information to be easily referred to.

In the specification, the "inspection content" is inspection content including not only an inspection item in each product and the inspection standard (for example, a threshold for quality determination) for the inspection item but also a process of determining whether to perform verification with the inspection standard for each item (hereinafter also referred to as ON/OFF of inspection). The inspection content data also includes current inspection content and candidates for new inspection content. In the specification, the term "setting" is used as a term that has a meaning including a change (correction). In the specification, the term "product" is used as a term that has a meaning including not only a completed product but also a so-called intermediate product. The setting-related information mentioned here includes not only information regarding a set time with the foregoing inspection content but also information regarding various viewpoints related to the setting of the inspection content. For example, the setting-related information may also include a person who sets the inspection content, the above-described base information, information regarding whether the setting of the inspection content is reflected in inspection (also a time in the case of the reflection, a lot number at the time of the reflection, or the like), information regarding whether there is an approver of the inspection content setting (a person who approves and when the approver approves), an event triggering a change when the inspection content is changed (occurrence of a defective product, frequent occurrence of false information, or the like), a change target item, a change value, and an inspection result (achievement value) after the inspection content is set.

In this configuration, the user can refer to the previous setting-related information, and thus it is possible to achieve an improvement of the quality of the inspection based on the information. When any problem occurs in a line or a market, for example, a defective product is generated, it is possible to check a situation when the inspection content which is a cause for the problem is set and it is possible to take appropriate countermeasures after the situation is checked.

The inspection management system may further include an inspection content setting approval unit configured to approve the inspection content set by the inspection content setting unit. The setting-related information may include information indicating a time at which the inspection content is set and/or a person who approves the inspection content.

In this configuration, a person who has an approving authority is decided, and thus the inspection content may not be able to be changed without obtaining the approval. Therefore, it is possible to prevent the inspection content from being inappropriately changed. Since the setting-related information includes the information regarding the approval, it is possible to authenticate the approval of the setting of the previous inspection content.

The approval mentioned herein also includes permission for setting inspection content without obtaining a separate approval and further includes permission for setting the inspection content, such as change in a specific item or a change in a value within a predetermined range without obtaining a separate approval under a predetermined condition.

The inspection management system may further include an inspection standard calculation unit configured to calculate an inspection standard more appropriate than a current inspection standard. The inspection content data acquisition unit may acquire the inspection standard calculated by the inspection standard calculation unit. The setting-related information may include base information indicating that the inspection standard calculated by the inspection standard calculation unit is appropriate.

In the inspection management system with this configuration, the appropriate inspection standard can be calculated and then the user can check the base information indicating why the inspection standard is considered to be an appropriate inspection standard. Thus, it is possible to easily determine whether to perform the inspection by adopting the inspection standard. The meaning of "more appropriate than the current inspection standard" mentioned herein is that excessive-looking and/or overlooking decreases more than in the related art by adopting the inspection standard.

The inspection management system may further include a new setting instruction unit configured to instruct the inspection apparatus to perform inspection in accordance with the inspection content set by the inspection content setting unit based on a command of a user and acquire feedback indicating whether the inspection apparatus accepts the instruction. The setting-related information may include information indicating that the instruction is given by the new setting instruction unit, indicating a time at which the instruction is given, and indicating a command by which the instruction is given, and information of the feedback.

Even when the user sets the inspection content, whether the inspection in which the content is actually reflected in the inspection device is performed may not be ascertained from the outside. From this viewpoint, in the inspection management system with this configuration, the user can check whether the inspection in which the set inspection content is reflected is performed.

The setting-related information may include comparison data between an inspection achievement in accordance with the new inspection content set by the inspection content setting unit and an inspection achievement before the new inspection content is set. In this configuration, the user can examine whether the inspection content is suitable based on the inspection achievement.

A predetermined setting limit value may be decided in inspection content which is able to be set by the inspection content setting unit. In such a configuration, for example, it is possible to prevent an unexpected error (for example, inspection content which may cause a serious problem is erroneously set) or a criminal act of a user with a malicious intention.

The production line managed by the inspection management system may include a plurality of manufacturing apparatuses and inspection apparatuses corresponding to a plurality of processes, and the inspection may include final inspection performed to inspect a completed product subjected to the plurality of processes and one or more intermediate inspections performed to inspect an intermediate product manufactured in the processes earlier than a final process. The inspection standard calculation unit may calculate an inspection standard by which a number of cases in which products determined to be defective products in the final inspection are also determined to be defective products in a stage of the intermediate inspection is more than the current inspection standard. The base information may include information regarding inspection in which products are determined to be defective products for the first time among products determined to be defective products in the final inspection and a number of cases of the inspection. Here, the "number of cases" refers to, for example, the number of cases in which the products are determined to be defective products per the total (same) number of inspections.

By determining that products determined to be defective products in the final inspection (hereinafter also referred to as actual defective products) are defective products in the inspection at an earlier stage, it is possible to remove a cause for deterioration in work efficiency in a subsequent process earlier, and thus it is possible to improve efficiency of the entire production line. That is, in the inspection management system with the foregoing configuration, the inspection standard for which the actual defective products can be detected in an earlier stage is calculated, and then the user can check the content. Therefore, it is possible to easily determine whether to perform the inspection by adopting the inspection standard.

The production line managed by the inspection management system may include a plurality of manufacturing apparatuses and inspection apparatuses corresponding to a plurality of processes, and the inspection may include final inspection performed to inspect a completed product subjected to the plurality of processes and one or more intermediate inspections performed to inspect an intermediate product manufactured in the processes earlier than a final process. The inspection standard calculation unit may calculate an inspection standard by which a first pass ratio which is an index related to detection of excessive defect in the intermediate inspection is higher than the current inspection standard. The base information may include the first pass ratio.

Here, the first pass ratio (hereinafter also simply referred to as the first pass ratio) is an index for determining the degree of detection of excessive defect (hereinafter also referred to as false information) indicating that a product determined to be a good-quality product in final inspection is determined to be a defective product in certain intermediate inspection. As a value of the first pass ratio is higher, more appropriate inspection content is set. The first pass ratio is obtained in accordance with a value obtained by dividing a number of products correctly determined to be good-quality products in certain intermediate inspection by a number of products determined to be good-quality products in the final inspection.

In the inspection management system with the foregoing configuration, the inspection standard by which the first pass ratio is higher than that of the current inspection standard is calculated, and then the user can check that the first pass ratio increases. Therefore, it is possible to easily determine whether to perform the inspection by adopting the inspection standard.

The production line may include a plurality of manufacturing apparatuses and inspection apparatuses corresponding to a plurality of processes, and the inspection may include final inspection performed to inspect a completed product subjected to the plurality of processes and one or more intermediate inspections performed to inspect an intermediate product manufactured in the processes earlier than a final process. One or more pieces of inspection content including at least the final inspection in inspection may be fixed, and the setting of the inspection content by the inspection content setting unit may be performed on the intermediate inspection different from the inspection in which the inspection content is fixed.

When the plurality of inspections corresponding to the plurality of manufacturing processes are performed, the inspection content in another process is changed due to the quality of a product in one process. For example, when the quality of an intermediate product in a previous process is excellent, a good-quality product is determined in the final inspection even though the inspection content of the product manufacturing in a subsequent process is loosely set. However, when the quality of the intermediate product in the previous process deteriorates and inspection in accordance with the same inspection content is performed in the subsequent process, the product may be determined to be a defective product in the final inspection (or inspection of the process). That is, when the inspection content in processes before and after one process is changed, the inspection content of the one process may become inappropriate. A circumstance in which the appropriate inspection content may not be set sometime in the end can occur.

From this viewpoint, when the inspection content in a certain process is fixed, only intermediate products conforming to the fixed inspection content is passed in a process subsequent to the process. Therefore, with this assumption, the appropriate inspection content of the process can be set. Even in the process at the stage previous to the process in which the inspection content is fixed, the inspection content that can pass the intermediate product from which the fixed inspection content at a subsequent stage can be cleared to the subsequent stage can be set as appropriate inspection content. That is, in the inspection management system with the foregoing configuration, it is possible to remove an obstacle when the appropriate inspection content is set.

The disclosure can be specified as an inspection management system or an inspection management apparatus including at least some of the foregoing units. The disclosure can be specified as a method performed by the inspection management system or the inspection management apparatus. The processes and the units can be freely combined for execution as long as technical inconsistency does not occur.

According to the aspects of the disclosure, it is possible to provide a technology for retaining information related to setting (including a change) of inspection content in an inspection apparatus as a history and enabling the information to be easily referred to.

Hereinafter, an embodiment of an embodiment of the disclosure will be described with reference to the drawings.

<Application Example>

FIG. 1 is a schematic diagram illustrating an inspection management system in a surface mount line of a printed board according to an application example. As illustrated in FIG. 1, in the surface mount line according to the application example, a solder printing apparatus A1, a post-solder-printing inspection apparatus B1, a mounter A2, a post-mounting inspection apparatus B2, a reflow furnace A3, and a post-reflow inspection apparatus B3 are provided in this order from the upstream side.

The solder printing apparatus A1 is an apparatus that prints solder of electrode parts on a printed board, the mounter A2 is an apparatus that places electronic components to be mounted on the board on a solder paste, and the reflow furnace A3 is a heating apparatus that performs solder bonding of the electronic components on the board. The inspection apparatuses B1 to B3 inspect board states at exits of processes and automatically detect defects or concern of defects. The inspection management system according to the application example includes the inspection apparatuses B1 to B3 and a management apparatus C that controls management of the inspection apparatuses B1 to B3.

The above-described manufacturing apparatuses A1 to A3 and inspection apparatuses B1 to B3 are connected to the management apparatus C via a network such as a LAN. The management apparatus C is configured as a general-purpose computer system including a CPU (processor), a main storage device (memory), an auxiliary storage device (a hard disk or the like), input devices (a keyboard, a mouse, a controller, a touch panel, and the like), and output devices (a display, a printer, a speaker, and the like).

Figure 2:
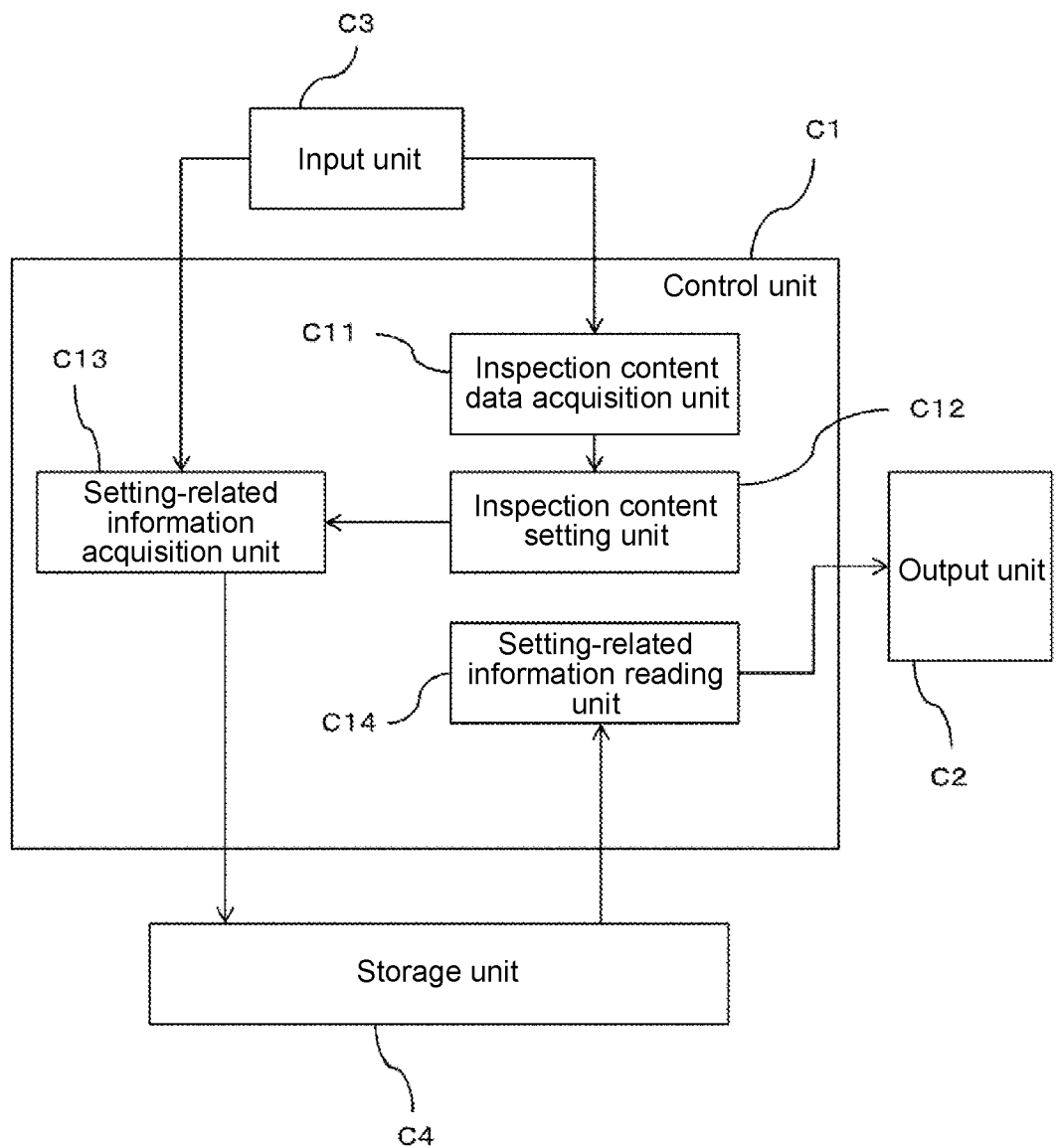
FIG. 2 is a functional block diagram illustrating a management apparatus according to the application example.

FIG. 2 is a schematic block diagram illustrating the management apparatus C according to the application example. As illustrated in FIG. 2, the management apparatus C includes a control unit C1, an output unit C2, an input unit C3, and a storage unit C4. Further, the control unit C1 includes an inspection content data acquisition unit C11, an inspection content setting unit C12, a setting-related information acquisition unit C13, and a setting-related information reading unit C14 as functional modules. Each function module may be realized, for example, when the CPU reads and executes a program stored in a storage device.

The inspection content data acquisition unit C11 acquires inspection content data including an inspection standard for each inspection item in each process. The inspection content setting unit C12 sets inspection content of each inspection apparatus based on the inspection content data acquired by the inspection content data acquisition unit C11.

The setting-related information acquisition unit C13 acquires the setting-related information including at least a time at which new inspection content is set when the new inspection content is set. Time information may be based on, for example, a clock contained in the management apparatus C or information regarding the time may be automatically acquired at the time of setting. The acquired setting-related information is stored (retained) as history information in the storage unit C4 along with the set new inspection content.

The setting-related information may include not only information regarding the setting time of the foregoing inspection content but also information regarding various viewpoints related to the setting of the inspection content. For example, the setting-related information may also include a person who sets the inspection content and a remark comment at the time of setting of the inspection content.

Figure 3:
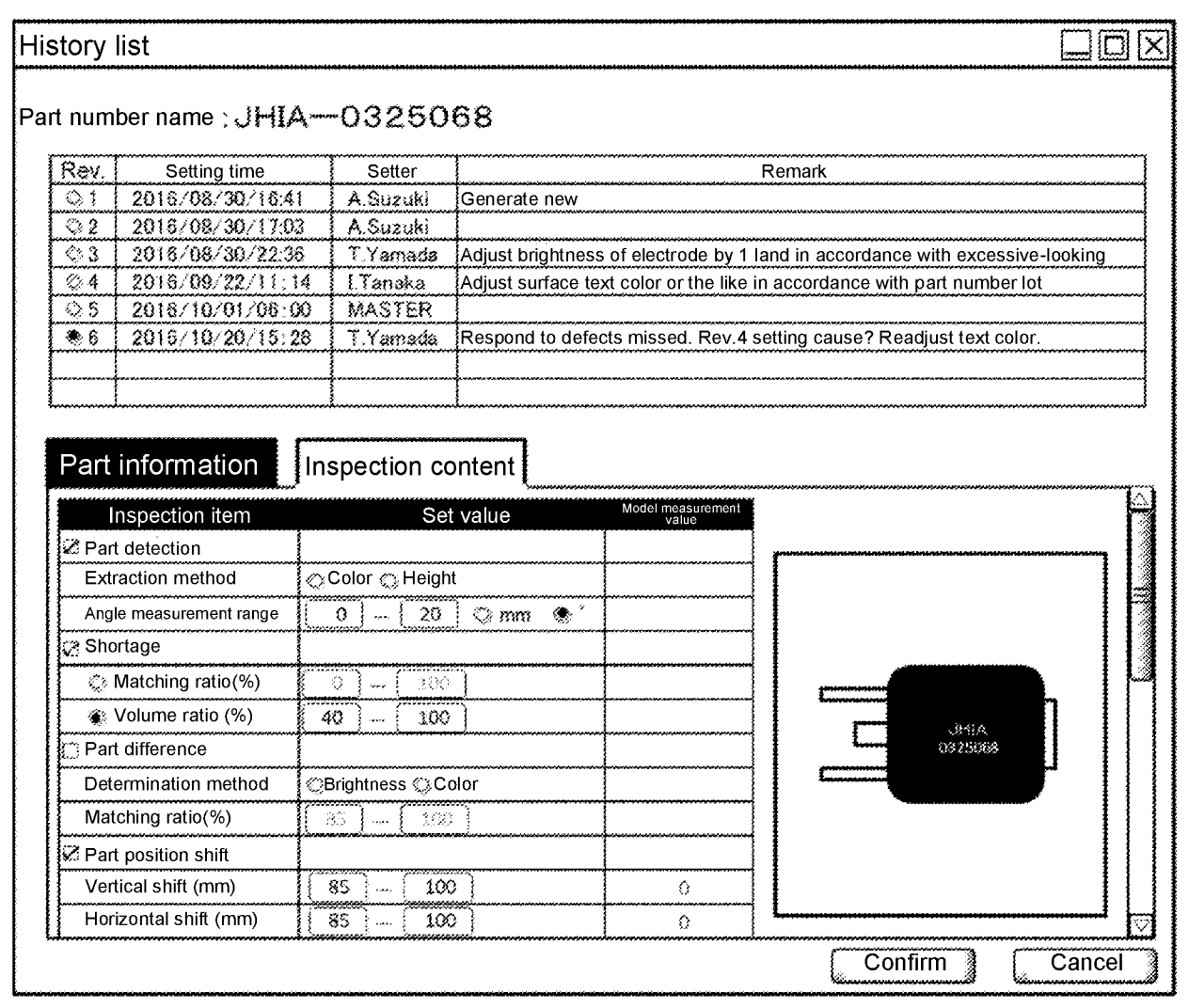

The setting-related information reading unit C14 reads history data of the setting-related information retained in the storage unit C4 in response to a request from a user and outputs the history data to the output unit C2. FIG. 3 illustrates an example of the displayed setting-related information.

As illustrated in FIG. 3, a display screen of the setting-related information is configured such that an inspection content change history is displayed in units of component part numbers. In the upper part, a target part number name, a revision number of inspection content used in the part number, a time at which the revision is set, a name of a person performing the setting, and remark information at the time of setting are displayed. In the lower part, specification information of the target part number and inspection content in the selected revision are displayed to be switchable along with a component image.

In the configuration of the application example, the user can refer to any of the foregoing history information. Therefore, it is possible to achieve an improvement in quality of inspection by utilizing such information. When any problem occurs in the production line or after shipment, for example, a defective product is generated, it is possible to check a situation when the inspection content which is a cause for the problem is set and it is possible to take appropriate countermeasures after the situation is checked.

Embodiment

Hereinafter, an embodiment of the disclosure will be described in more detail. Here, dimensions, materials, shapes, relative dispositions, and the like of constituent elements to be described in the embodiment are not construed to limit the scope of the disclosure unless particularly otherwise mentioned.

(System Configuration)

Figure 4:
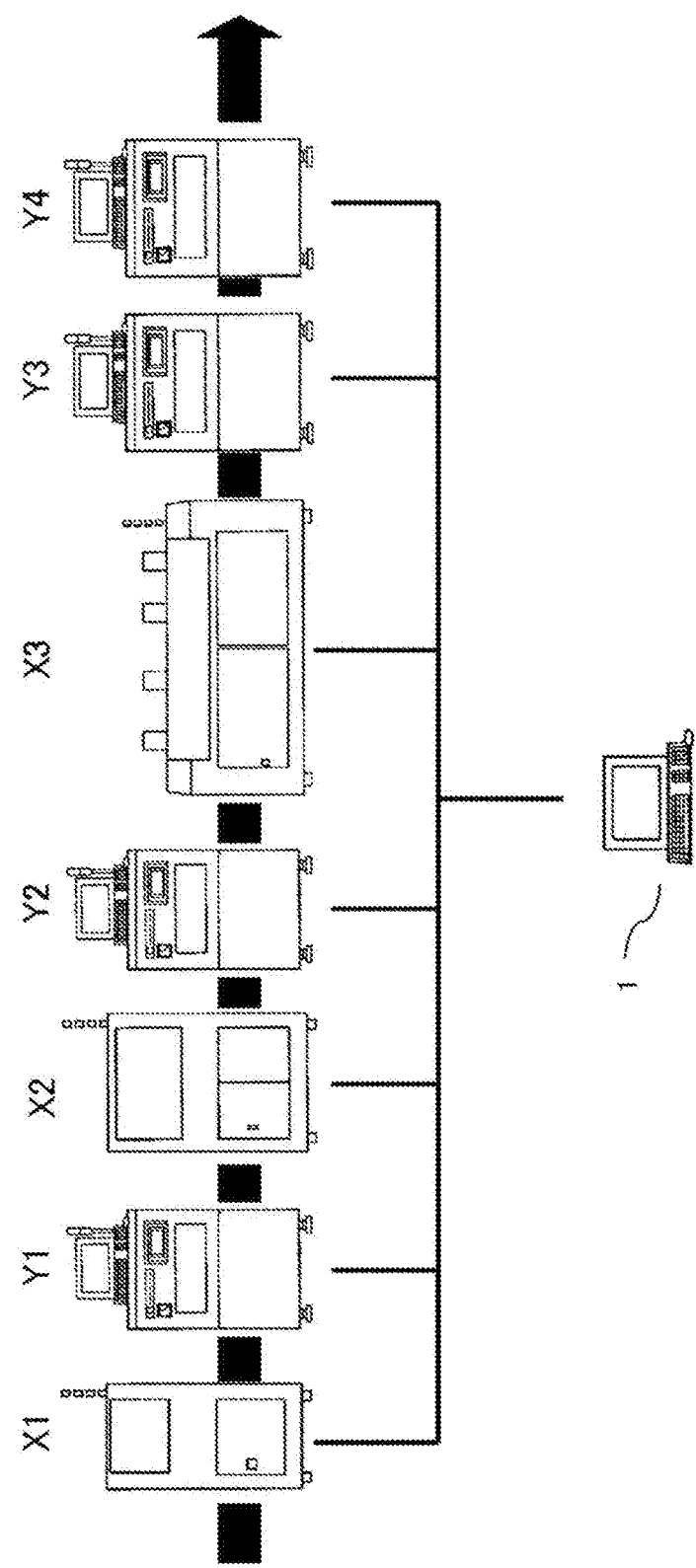
FIG. 4 is a diagram illustrating a configuration of a production line and an inspection management system according to an embodiment.

FIG. 4 schematically illustrates a configuration example of a manufacturing facility and an inspection management system in a surface mount line of a printed board according to the embodiment. Surface mount technology (SMT) is a technology for soldering electronic components on the surface of a printed board and a surface mount line mainly includes three processes of solder printing, component mounting, and a reflow (solder welding).

As illustrated in FIG. 4, in the surface mount line, a solder printing apparatus X1, a mounter X2, and a reflow furnace X3 are provided as manufacturing apparatuses in this order from the upstream side. The solder printing apparatus X1 is an apparatus that prints solder in a paste shape on an electrode unit (called a land) on a printed board by screen printing. The mounter X2 is an apparatus that picks up electronic components to be mounted on the board and places the electronic components on the solder paste at corresponding portion and is also called a chip mounter. The reflow furnace X3 is a heating apparatus that heats and melts the solder paste, then performs cooling, and performs solder bonding of the electronic components on the board. When the number or kinds of electronic components to be mounted on the board is large, a plurality of mounters X2 may be provided in the surface mount line in some cases. In the surface mount line, an inspection management system that inspects board states at an exit of each process of the solder printing, the component mounting, and the reflow and automatically detects defects or concern of defects is installed. The inspection management system according to the embodiment includes a management apparatus 1 and four kinds of inspection apparatuses, namely a post-solder printing inspection apparatus Y1, a post-mounting inspection apparatus Y2, an exterior inspection apparatus Y3, and an X-ray inspection apparatus Y4.

The post-solder printing inspection apparatus Y1 is an apparatus that inspects a printing state of a solder paste on a board carried out from the solder printing apparatus X1. The post-solder printing inspection apparatus Y1 measures the solder paste printed on the board 2-dimensionally or 3-dimensionally and determines whether various inspection items are suitable for preset inspection standards based on measurement results. Examples of the inspection items include a volume, an area, a height, a position shift, a shape, and the like of solder. In the 2-dimensional measurement of the solder paste, an image sensor (camera) or the like can be used. In the 3-dimensional measurement, a laser displacement meter, a phase shift method, a space coding method, an optical cutting method, or the like can be used.

The post-mounting inspection apparatus Y2 is an apparatus that inspects disposition states of electronic components on the board carried out from the mounter X2. The post-mounting inspection apparatus Y2 measures components (which may be a component body or part of the components such as electrodes) placed on the solder pastes 2-dimensionally or 3-dimensionally and determines whether the various inspection items are suitable for preset inspection standards based on measurement results. As the inspection items, for example, a position shift of component, an angle (rotational) shift, a missing component (no component is disposed), a component difference (different components are disposed), a polarity difference (polarities of electrodes on a component side and a board side are different), front and rear reversal (components are disposed in the rear direction), a component height, and the like are included. Like the post-printing inspection, an image sensor (camera) or the like can be used in the 2-dimensional measurement of the electronic component. In the 3-dimensional measurement, a laser displacement meter, a phase shift method, a space coding method, an optical cutting method, or the like can be used.

The exterior inspection apparatus Y3 is an apparatus that inspects quality of soldering on the board carried out from the reflow furnace X3. The exterior inspection apparatus Y3 measures the solder portion after the reflow 2-dimensionally or 3-dimensionally and determines whether the various inspection items meet preset inspection standards based on measurement results. In addition to the same items as the component inspection, the inspection items include the quality of a solder fillet shape and the like. In measurement of the shape of solder, a so-called color highlight scheme (a method of detecting a 3-dimensional shape of solder as 2-dimensional color information by applying illumination of R, G, and B to the solder surface at different incident angles and photographing the reflected light of each color with a zenith camera) can be used in addition to the above-described laser displacement meter, phase shift method, space coding method, optical cutting method, or the like.

The X-ray inspection apparatus Y4 is an apparatus that inspects a state of a soldering of the board by using an X-ray image. For example, in the case of a package component or a multi-layered board such as a ball grid array (BGA) or a chip size package (CSP), solder joint portions are hidden on the bottom of components or a board, and solder states may not be inspected in the exterior inspection apparatus Y3 (that is, in an exterior image). The X-ray inspection apparatus Y4 is an apparatus that complements weakness of the exterior inspection. The inspection items of the X-ray inspection apparatus Y4 include, for example, a position shift of a component, a solder height, a solder volume, a solder ball diameter, the length of a back fillet, a quality of a solder joint, and the like. As the X-ray image, an X-ray transmission image may be used or a computed tomography (CT) image may be used. In the following description, the exterior inspection apparatus Y3 and the X-ray inspection apparatus Y4 are collectively referred to as a post-reflow inspection apparatus in some cases.

Each of the inspection apparatuses Y1 to Y4 according to the embodiment may include a display device to check an inspection target product for visual observation, and the display device for visual observation may be provided as a terminal separate from each inspection apparatus.

In the embodiment, a board processed by the solder printing apparatus X1 and the mounter X2 is an intermediate product and a board carried out from the reflow furnace X3 is a completed product. The inspection performed by the post-solder printing apparatus Y1 and the post-mounting inspection apparatus Y2 is intermediate inspection, and the inspection performed by the exterior inspection apparatus Y3 and the X-ray inspection apparatus Y4 is final inspection. Hereinafter, the inspection performed by the post-solder printing apparatus Y1 is referred to as post-printing inspection, the inspection performed by the post-mounting inspection apparatus Y2 is referred to as post-mounting inspection, and the inspection performed by the exterior inspection apparatus Y3 and the X-ray inspection apparatus Y4 is referred to as post-reflow inspection in some cases.

(Management apparatus)

The above-described manufacturing apparatuses X1 to X3 and inspection apparatuses Y1 to Y4 are connected to the management apparatus 1 via a network (LAN). The management apparatus 1 is a system that serves to manage or control the manufacturing apparatuses X1 to X3 and the inspection apparatuses Y1 to Y4 and is configured as a general-purpose computer system including a CPU (processor), a main storage device (memory), an auxiliary storage device (a hard disk or the like), input devices (a keyboard, a mouse, a controller, a touch panel, and the like), and the like.

The management apparatus 1 may be configured by a single computer or may be configured by a plurality of computers. Alternatively, some or all of the functions of the management apparatus 1 can also be mounted on a computer that contains any apparatus of the manufacturing apparatuses X1 to X3 and the inspection apparatuses Y1 to Y4. Alternatively, some of the functions of the management apparatus 1 may be realized by a server (a cloud server or the like) on a network.

Figure 5:
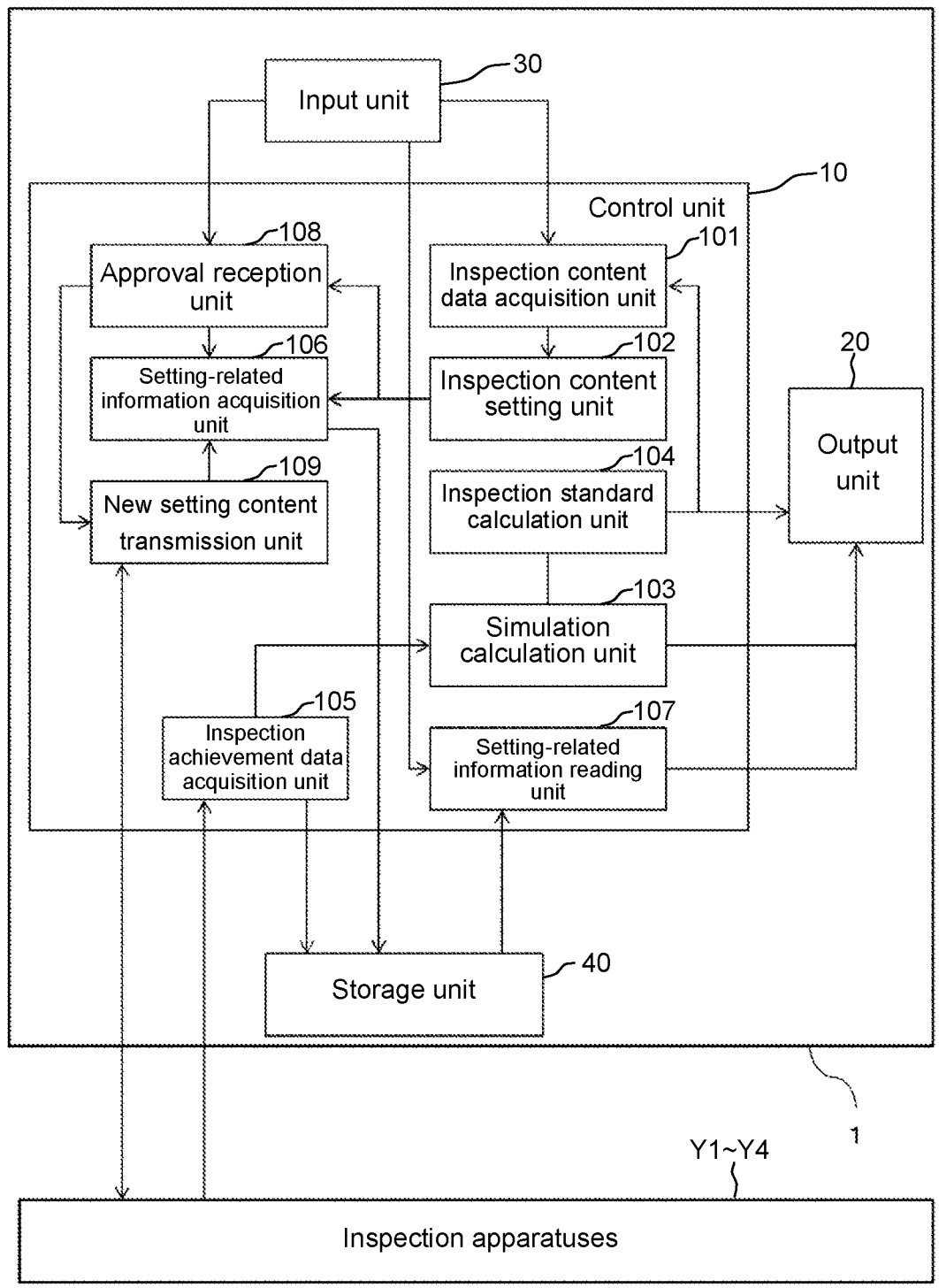
FIG. 5 is a functional block diagram illustrating a management apparatus according to the embodiment.

FIG. 5 is a functional block diagram illustrating the management apparatus 1 according to the embodiment. As illustrated in FIG. 5, the management apparatus 1 includes a control unit 10, an output unit 20, an input unit 30, and a storage unit 40. Further, the control unit 10 includes, an inspection content data acquisition unit 101, an inspection content setting unit 102, a simulation calculation unit 103, an inspection standard calculation unit 104, an inspection achievement data acquisition unit 105, a setting-related information acquisition unit 106, a setting-related information reading unit 107, an approval reception unit 108, and a new setting content transmission unit 109 as functional modules. Each functional module may be realized, for example, when a CPU reads and executes a program stored in a storage device such as a main storage device.

The inspection content data acquisition unit 101 acquires inspection content data including an inspection standard for each inspection item in each process. As will be described below, a value of the inspection standard calculated by the inspection standard calculation unit 104 may be acquired and a value input by a user may be acquired via the input unit 30.

The inspection content setting unit 102 sets inspection content of the inspection apparatuses Y1 to Y4 based on the inspection content data acquired by the inspection content data acquisition unit 101.

The simulation calculation unit 103 sets assumed inspection content based on training data to be described below and performs simulation inspection in the inspection content. The inspection standard calculation unit 104 calculates an inspection standard more appropriate than a current inspection standard based on a result of the simulation inspection. For example, an inspection standard used in the simulation in which overlooking and/or excessive-looking is reduced more than in the current inspection standard is set as an appropriate inspection standard.

The inspection achievement data acquisition unit 105 acquires information regarding an inspection achievement (result) from the inspection apparatus of each process. The data includes a value for each good-quality product or a defective product in each inspection item. At least some of the acquired inspection achievements are used as training data for the simulation inspection. When the inspection achievements are acquired as the training data, for example, appropriate data can be collected by actually manufacturing a predetermined number of boards, returning the boards determined to be defective products in the intermediate inspection to the production line, and performing the final inspection. When the boards determined to be the defective products in the intermediate inspection are returned to the production line and when the board are returned after a repair is performed, any process is not performed because of actual defects. When the boards are returned to the production line (when excessive-looking occurs), information such as false information is registered. In this way, more appropriate training data can be obtained.

When new inspection content is set, the setting-related information acquisition unit 106 acquires setting-related information including information regarding a time at which at least the new inspection content is set. Time information may be based on, for example, a clock contained in the management apparatus 1 or information regarding the time may be automatically acquired at the time of setting. The acquired setting-related information is stored (retained) as history information in the storage unit 40 along with the set new inspection content.

The setting-related information may include not only the information regarding the set time of the foregoing inspection content but also information regarding various viewpoints related to the setting of the inspection content. For example, the setting-related information may also include a person who sets the inspection content, information regarding whether the setting of the inspection content is reflected in inspection (also a time in the case of the reflection, a lot number at the time of the reflection, or the like), information regarding whether there is an approver of the inspection content setting (a person who approves and when the approver approves), an event triggering a change when the inspection content is changed (occurrence of a defective product, frequent occurrence of false information, or the like), a change target item, a change value, and an inspection result (achievement value) after the inspection content is set. The setting-related information may also include base information when the inspection standard calculation unit 104 calculates the appropriate inspection standard. The base information will be described below.

The information may be acquired in accordance with an input via the input unit 30. For example, the information is automatically acquired in cooperation with each functional module in order to prevent wrong information from being input.

The setting-related information reading unit 107 reads history data of the setting-related information retained in the storage unit 40 in response to a request from the user and outputs the history data to the output unit 20. Thus, the user can refer to any of the various kinds of setting-related information, and thus it is possible to achieve an improvement of the quality of the inspection by utilizing the information. When any problem occurs in the production line or after shipment, for example, a defective product is generated, it is possible to check a situation when the inspection content which is a cause for the problem is set and it is possible to take appropriate countermeasures after the situation is checked.

The approval reception unit 108 receives the approval of the user with regard to the set inspection content. The new setting content transmission unit 109 instructs the inspection apparatus to perform inspection of the inspection content for which the approval is obtained and acquires a feedback indicating whether the inspection apparatus receives the instruction.

The "approval" includes not only approval of the inspection content set by the inspection content setting unit 102 by an operator in charge but also approval by a person who has a predetermined approval authority. Approvals in a plurality of stages (for example, an operator, a chief, a quality management manager, and the like) may be received. The approval may be provided separately from the management apparatus 1 for the approver who performs approval.

The approval includes permission for setting inspection content without obtaining a separate approval and further includes permission for setting the inspection content, such as change in a specific item or a change in a value within a predetermined range without obtaining a separate approval under a predetermined condition.

The input unit 30 is an input unit for the management apparatus 1 and generally includes a keyboard, a mouse, a controller, a touch panel, and the like. The output unit 20 is a unit that outputs various kinds of information such as setting-related information, inspection content data, and an inspection achievement and generally includes a display device such as a liquid crystal display. When the output unit 20 is a display device, a user interface screen may be output to the output unit 20.

The storage unit 40 is a storage device that stores various kinds of information such as training data and inspection content data in addition to the setting-related information and may include, for example, an external storage device such as a server.

(Flow of Inspection Content Setting Process)

Figure 6:
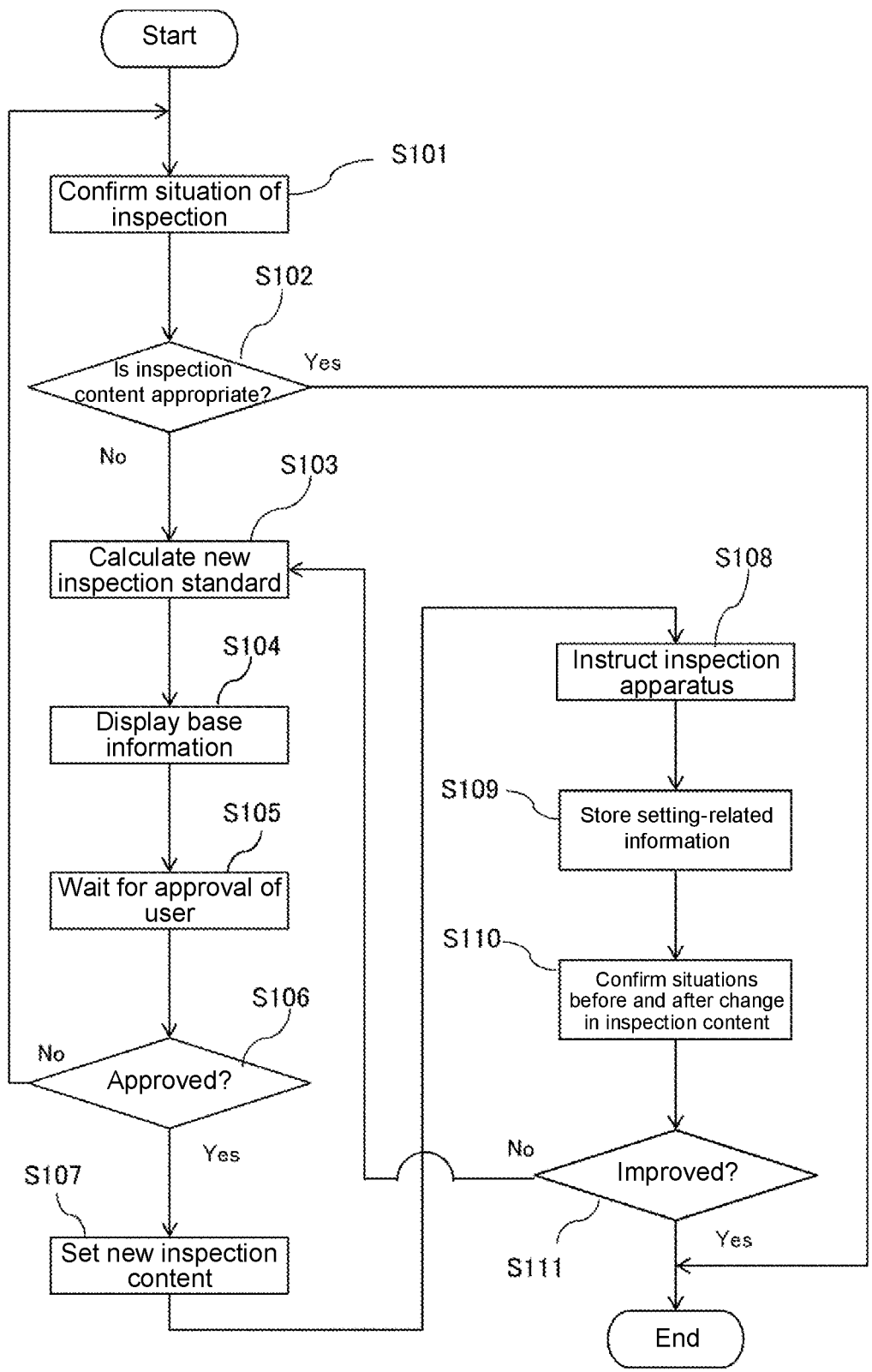
FIG. 6 is a flowchart illustrating a flow of a process of inspection content setting according to the embodiment.

Next, a flow of a process when inspection content is set by the inspection management system according to the embodiment will be described. FIG. 6 is a flowchart illustrating the flow of the process.

As illustrated in FIG. 6, the management apparatus 1 first performs a process of checking a situation of inspection performed by the inspection apparatuses Y1 to Y4 based on inspection achievement data (step S101) and determines whether the currently applied inspection content is appropriate based on the situation of the inspection (step S102). Whether the inspection content is appropriate is determined, for example, by determining whether a number of actual defective products is greater than a predetermined value in the final inspection or a first pass ratio in the intermediate inspection is less than a predetermined value. When the number of actual defective products is greater than the predetermined value or the first pass ratio is less than the predetermined value, it is determined that the current inspection content is not appropriate.

When it is determined in step S102 that the current inspection content is appropriate, it is not necessary to set new inspection content. Therefore, this routine ends temporarily. Conversely, when it is determined in step S102 that the current inspection content is not appropriate, appropriate inspection standard is calculated (step S103). Then, the calculated inspection standard and the base information for which the inspection standard is determined to be appropriate are output to the output unit 20 (step S104) and the management apparatus 1 waits for performing the inspection using the inspection standard until the user approves (or disapproves) (step S105).

In step S106, it is determined whether the user approves or disapproves of the setting of the new inspection standard. When the user disapproves, the process returns to step S101 to repeat the process. Conversely, when the approval of the user is obtained in step S106, the inspection content obtained using the new inspection standard is set (step S107). The inspection apparatus is instructed to inspect the inspection content (step S108). Then, the setting-related information including the fact that the new inspection content is set and a time at which the new inspection content is set is stored as history data in the storage unit 40 (step S109). Further, the situations of the inspection before and after the change in the inspection content are checked (compared) (step S110) and it is determined whether the situation of the inspection is improved (step S111). At the time of the checking of step S110, a screen which can be understood visually by the user may be displayed on the output unit 20.

In step S111, when the inspection quality is improved, this routine ends temporarily. When the inspection quality is not improved, the process returns to step S103 to repeat the process. The flow of the foregoing process may be repeatedly performed periodically (for example, whenever a predetermined time has passed or whenever a predetermined number of processes is performed).

When the inspection apparatus is instructed in the foregoing step S108, whether the inspection apparatus receives (receives and approves of) the instruction and whether the inspection is performed in accordance with the new inspection content are checked. The checked information may also be included in the setting-related information stored in the storage unit 40 in step S109.

(Number of Actual Defect Detections and First Pass Ratio)

Next, a relation between the number of actual defect detections and the first pass ratio will be described with reference to FIG. 7. The first pass ratio is an index for determining the degree of false information indicating that a product determined to be a good-quality product in final inspection is determined to be a defective product in certain intermediate inspection. As a value of the first pass ratio is higher, more appropriate inspection content is set. The first pass ratio is obtained in accordance with a value obtained by dividing the number of products correctly determined to be good-quality products in certain intermediate inspection by the number of products determined to be good-quality products in the final inspection.

The table in the upper part of the drawing shows an inspection result before changing an inspection standard and the table in the lower part shows an inspection result when the inspection standard is changed. Before and after a change in the inspection standard, actually defective boards determined to be defective products in inspection after the reflow are the same and 7 boards, boards No. 1 to No. 7, are actually defective products.

Here, in the post-printing inspection before the change in the inspection standard, 7 boards determined to be good-quality products are determined to be defective products in the post-reflow inspection in addition to actual defective products of boards No. 1 to No. 3. In addition 4 boards, boards No. 4 to No. 7, which are actually defective products are determined to be good-quality products. In this case, in the post-printing inspection, boards which can be inspected correctly are 3 boards determined to be defective products among boards determined to be actually defective products finally and 86 boards determined to be good-quality products among the boards determined to be good-quality products finally. Of these boards, the 3 actually defective boards determined to be defective products are counted as the number of (correct) defective detections and the 86 good-quality boards correctly determined to be good-quality products are used to calculate a first pass ratio. That is, since the number of boards determined to be good-quality products is 93 in the final inspection, a first pass ratio is calculated to about 92.5%, which is calculated by multiplying a value obtained by dividing 86 by 93 by 100.

Similarly, in the post-mounting inspection before the change in the inspection standard, the number of boards correctly determined to be defective products is 0 and the number of correctly determined to be good-quality products is 91. Therefore, the number of defect detections is 0 and the first pass ratio is calculated to about 97.8%.

On the other hand, in the post-printing inspection after the change in the inspection standard, the number of boards correctly determined to be defective products is 3 which is the same as that before the change and the number correctly determined to be good-quality products increases to 92. Therefore, the first pass ratio is improved to about 98.9%.

In the post-mounting inspection after the change in the inspection standard, the number of boards correctly determined to be defective products is 2 and one of the two boards has already been detected to be a defective product in the post-printing inspection. Therefore, the remaining one board is correctly determined to be a defective product for the first time in the post-mounting inspection, and thus is counted as the number of defect detections. Since the number of good-quality boards correctly determined to be good-quality products is 93, the first pass ratio is improved to 100%.

(Base Information of Adaptation of Inspection Standard)

Figure 8:
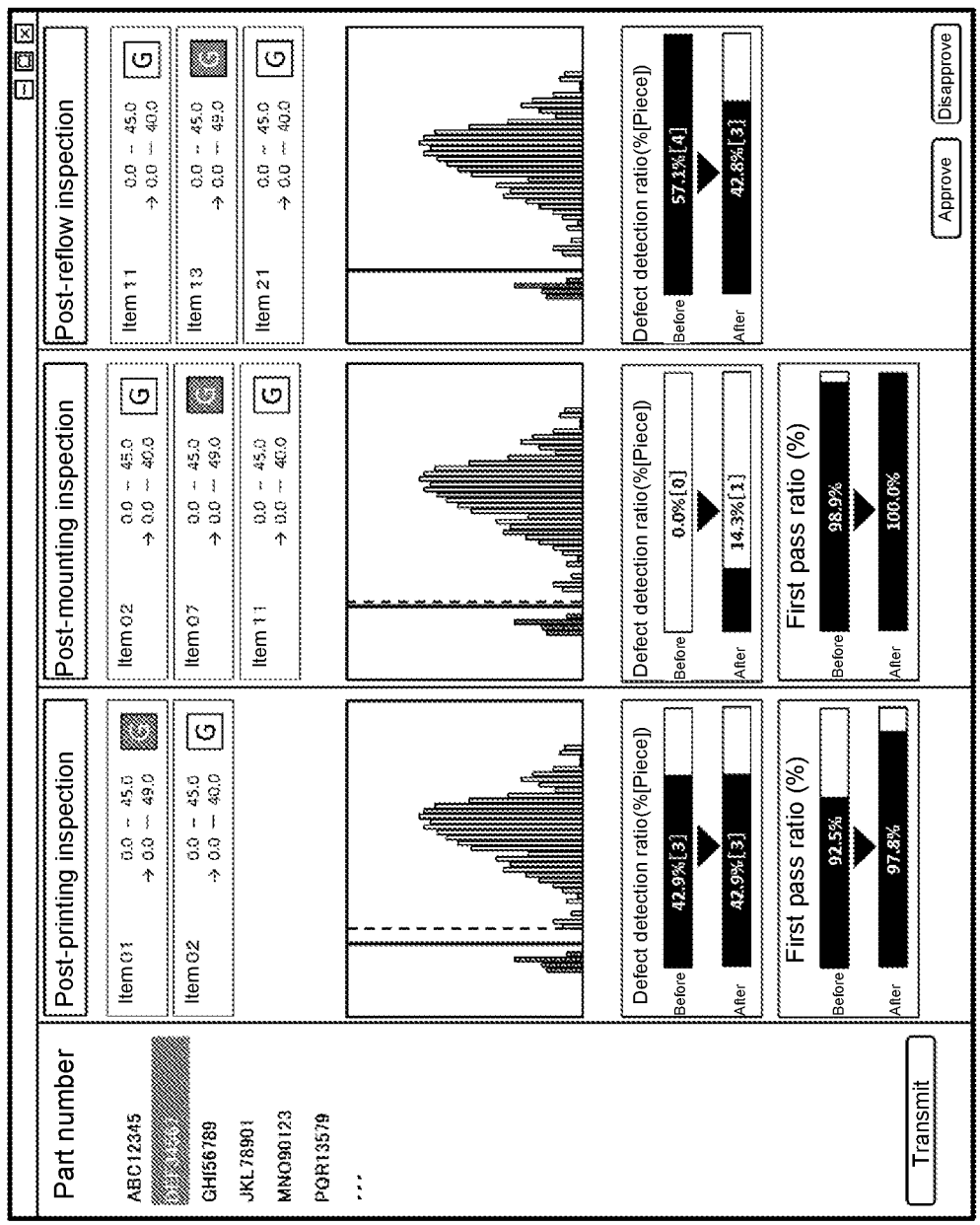
FIG. 8 is a diagram illustrating a display example of base information according to the embodiment.

Incidentally, even when the user views only a value of the calculated new inspection standard, it may not be determined whether the inspection standard is really appropriate. Therefore, in step S104 of the flow of the foregoing process, the inspection standard calculation unit 104 displays the base information in which the inspection standard is adopted on the output unit 20 so that the user can determine whether to adopt the new inspection standard. An example of a screen on which the base information is displayed is illustrated in FIG. 8. In the leftmost column in the figure, a list of part numbers of components for which the foregoing inspection standards are calculated is displayed and detailed information of a part number selected from the list is displayed in the right column. The right column is partitioned into three pieces. The inspection standards for the post-printing inspection, the post-mounting inspection, and the post-reflow inspection and simulation results obtained using the inspection standards are displayed in this order from the left end.

In the upper part of the right column in the figure, a list of inspection items for which it is determined that there is room for improvement and values of the inspection standards corresponding to the inspection items are displayed. In particular, in the post-printing inspection and the post-mounting inspection, the inspection standards before the change (From) and after the change (To) are displayed.

In the middle part of the right column in the figure, for each inspection item selected in the upper part, a histogram of measurement values is displayed along with a line indicating the inspection standard before the change and a line indicating the inspection standards to be set. With respect to the inspection items of the post-printing inspection and the post-mounting inspection, for example, for each section of the measurement values, the histogram is displayed in a manner that the number of components of the good-quality products and the number of components of the defective products after the reflow are aggregated and color-coded. Thus, since how to determine the good-quality products and the defective products after the reflow in the inspection process is displayed to be identifiable, it is possible to check whether there is a possibility of overlooking or excessive-looking of a defect with regard to the inspection standard newly set in the post-printing inspection and the post-mounting inspection and the inspection standard is improved more than the inspection standard before the change.

In an upper portion of the lower part of the right column in the figure, a number of actual defective products detected for the first time in the inspection process and a ratio of the number of actual defective products to the number of all actual defective products before and after the change in the inspection standard are displayed. For example, a simulation is performed as follows. Components determined to be defective in accordance with the new inspection standard are considered to be excluded in the process, and only components determined to be good-quality products in the previous process are inspected in a subsequent process (the post-mounting inspection after the post-printing inspection). Thus, in the post-printing inspection and the post-mounting inspection, the user can check how many the defective products are actually detected or how many defects are overlooked before and after the change in the inspection standard.

In the lower portion of the lower part, the first pass ratios before and after the change in the inspection standard in the post-printing inspection and the post-mounting inspection are displayed along with graphs. Thus, in the post-printing inspection and the post-mounting inspection, the user can check the degree of excessive-looking occurring before and after the change in the inspection standard.

With reference to each of the foregoing items, the user can select whether to adopt the indicated inspection standard and decide to adopt the inspection standard using a button in the lower right portion of the screen.

In the inspection management system according to the above-described embodiment, when there is a problem in the inspection content, the appropriate inspection standard is obtained based on the simulation so that the user can check the base information indicating that the inspection standard is appropriate. Therefore, the user can easily decide to adopt the inspection standard. Since any of various kinds of setting-related information can be referred to, it is possible to achieve an improvement in quality of inspection by utilizing such information. When any problem occurs in the production line or after shipment, for example, a defective product occurs, it is possible to check a situation when the inspection content which is a cause for the problem is set and it is possible to take appropriate countermeasures after the situation is checked.

<Modification Examples>

In the foregoing embodiment, in the inspection of any process, the inspection content can be changed without limit when a person who has an authority approves. However, the inspection content related to the inspection of one or more processes may be set so that a change in the inspection content is not possible.

When a plurality of inspections corresponding to the plurality of manufacturing processes are performed, the inspection in the other processes is affected due to the quality of a product in one process in some cases. For example, when the inspection content of the post-mounting inspection apparatus Y2 is set to an appropriate value in accordance with the method of the foregoing embodiment and then the inspection content of the post-solder printing inspection apparatus Y1 is set (changed) to an appropriate value in accordance with the same method, the inspection content of the post-mounting inspection apparatus Y2 in which the appropriate value is set for a while may become inappropriate.

Specifically, the first setting of the inspection content of the post-mounting inspection apparatus Y2 is performed on a board determined to be a good-quality product in the inspection content of the post-solder printing inspection apparatus Y1 at that point of time and then moved to the mounting process to appropriately determine whether the board is a defective product or a good-quality product after mounting. However, the inspection content of the post-solder printing inspection apparatus Y1 may be subsequently changed and the quality of a board moved as a good-quality product to the mounting process may be changed. For this reason, a circumstance in which the first set inspection content of the post-mounting inspection apparatus Y2 becomes inappropriate may occur.

From the viewpoint, for example, when the inspection content of the post-solder printing apparatus Y1 is fixed, only a board conforming to the fixed inspection content flows in the mounting step, so that with this assumption, the inspection content appropriate for this process can be set. That is, in the inspection management system with the foregoing configuration, it is possible to remove an obstacle when the appropriate inspection content is set.

Instead of limiting the change in the inspection content on a process-by-process basis, a limit of the inspection content which can be set by the inspection content setting unit 102 may be decided. For example, the limit may be decided by setting a lower limit in a loose case of the inspection standard or setting an inspection item in which the inspection is not allowed to be turned off. The limit may be set as a limit value of the system at the time of start-up of the system or may be set by an authorized user. Based on a previous inspection achievement, the limit may be automatically set. A unit in which the limit is set may be freely decided, it may be set for each inspection item, or the limit may be set for each part number of a component. In such a configuration, for example, it is possible to prevent an unexpected error (for example, inspection content which may cause a serious problem is erroneously set) or a criminal act of a user with a malicious intention.

<Others>

The description of the foregoing embodiment is merely exemplary description of the disclosure. The disclosure is not limited to the foregoing form. The disclosure can be modified in various forms within the scope of the technical ideas. For example, in the foregoing embodiment, step S101 is performed by the management apparatus 1 in the flow of the process of changing the inspection content, but the process may be started by a user. In this case, whether an inspection situation is appropriate may be determined based on visual information of an inspection achievement output to the output unit 20.

An aspect of the disclosure provides an inspection management system that manages inspection of an inspection apparatus (Y1; Y2; Y3; Y4) in a production line including a manufacturing apparatus (X1; X2; X3) of a product and the inspection apparatus inspecting the product manufactured by the manufacturing apparatus. The inspection management system includes: an inspection content data acquisition unit (101) configured to acquire inspection content data including an inspection standard for each inspection item of the product; an inspection content setting unit (102) configured to set inspection content based on the inspection content data acquired by the inspection content data acquisition unit; a setting-related information acquisition unit (106) configured to acquire setting-related information including at least a time at which new inspection content is set when the new inspection content is set by the inspection content setting unit; a storage unit (40) configured to retain the setting-related information acquired by the setting-related information acquisition unit in association with a history of the setting of the inspection content; a setting-related information reading unit (107) configured to read the setting-related information retained in the storage unit; and an output unit (20) configured to be able to output at least the setting-related information read by a setting-related information reading unit.

Another aspect of the disclosure provides a method which has a plurality of processes and manages, in a product production line including a plurality of manufacturing apparatuses (X1; X2; X3) and inspection apparatuses (Y1; Y2; Y3; Y4) corresponding to the plurality of processes, final inspection performed to inspect a completed product subjected to the plurality of processes and one or more intermediate inspections performed to inspect an intermediate product manufactured in the processes earlier than a final process. The method includes: a first step (S101) of checking an inspection situation by the inspection apparatus; a second step (S102) of determining whether inspection content is appropriate based on the inspection situation checked in the first step; a third step (S103) of calculating an appropriate inspection content when it is determined in the second step that the inspection content is not appropriate; a fourth step (S104) of presenting the appropriate inspection content calculated in the third step to a user along with base information indicating that the inspection content is appropriate; a fifth step (S105) of receiving an approval from the user for performing the inspection in accordance with the inspection content presented in the fourth step; a sixth step (S107) of setting the inspection content by the inspection apparatus to new inspection content when the approval is received from the user in the fifth step; and a seventh step (S109) of storing data of the new inspection content as history information along with setting-related information including a time at which at least the new inspection content is set when the new inspection content is set in the sixth step.

What is claimed is:

1. An inspection management system that manages inspection of an inspection apparatus in a production line comprising a manufacturing apparatus of a product and the inspection apparatus inspecting the product manufactured by the manufacturing apparatus, the inspection management system comprising:
    an inspection content data acquisition unit configured to acquire inspection content data comprising an inspection standard for each inspection item of the product;
    an inspection content setting unit configured to set inspection content based on the inspection content data acquired by the inspection content data acquisition unit;
    a setting-related information acquisition unit configured to acquire setting-related information comprising at least a time at which new inspection content is set when the new inspection content is set by the inspection content setting unit;
    a storage unit configured to retain the setting-related information acquired by the setting-related information acquisition unit in association with a history of the setting of the inspection content;

a setting-related information reading unit configured to read the setting-related information retained in the storage unit; and an output unit configured to output at least the setting-related information read by the setting-related information reading unit.

2. The inspection management system according to claim 1, further comprising:

an inspection content setting approval unit configured to approve the inspection content set by the inspection content setting unit, wherein the setting-related information comprises at least one of information indicating a time at which setting of the inspection content is approved and information indicating a person who approves the inspection content.

3. The inspection management system according to claim 1, further comprising:

an inspection standard calculation unit configured to calculate an inspection standard more appropriate than a current inspection standard, wherein the inspection content data acquisition unit acquires the inspection standard calculated by the inspection standard calculation unit, wherein the setting-related information comprises base information indicating that the inspection standard calculated by the inspection standard calculation unit is appropriate, and wherein the output unit outputs the base information and the inspection standard calculated by the inspection standard calculation unit.

4. The inspection management system according to claim 1, further comprising:

a new setting instruction unit configured to instruct the inspection apparatus to perform inspection in accordance with the inspection content set by the inspection content setting unit based on a command of a user and acquire feedback indicating whether the inspection apparatus accepts the instruction, wherein the setting-related information comprises information indicating that the instruction is given by the new setting instruction unit, indicating a time at which the instruction is given, and indicating a command by which the instruction is given, and information of the feedback.

5. The inspection management system according to claim 1, wherein the setting-related information comprises comparison data between an inspection achievement in accordance with the new inspection content set by the inspection content setting unit and an inspection achievement before the new inspection content is set.

6. The inspection management system according to claim 1, wherein a predetermined setting limit value is defined for the inspection content which is able to be set by the inspection content setting unit.

7. The inspection management system according to claim 1, wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process.

8. The inspection management system according to any one of claim 3, wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process, wherein the inspection standard calculation unit calculates an inspection standard by which a number of cases in which products determined to be defective products in the final inspection are also determined to be defective products in a stage of the intermediate inspection is more than the current inspection standard, and wherein the base information comprises information regarding inspection in which products are determined to be defective products for the first time among products determined to be defective products in the final inspection and a number of cases of the inspection.

9. The inspection management system according to claim 3, wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process, wherein the inspection standard calculation unit calculates an inspection standard by which a first pass ratio which is an index related to detection of excessive defect in the intermediate inspection is higher than the current inspection standard, and wherein the base information comprises the first pass ratio which is an index related to detection of excessive defect in the intermediate inspection.

10. The inspection management system according to claim 7, wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process, wherein one or more pieces of inspection content comprising at least the final inspection in inspection are fixed, and the setting of the inspection content by the inspection content setting unit is performed on the intermediate inspection different from the inspection in which the inspection content is fixed.

11. An inspection apparatus that is included in the inspection management system according to claim 1, the inspection management apparatus comprising:

the inspection content data acquisition unit;
the inspection content setting unit;
the setting-related information acquisition unit;
the storage unit;
the setting-related information reading unit; and
the output unit.

12. An inspection management method of managing inspection of an inspection apparatus in a production line comprising a manufacturing apparatus of a product and the inspection apparatus inspecting the product manufactured by the manufacturing apparatus, the inspection management method comprising:
- a first step of checking an inspection situation by the inspection apparatus;
- a second step of determining whether inspection content is appropriate based on the inspection situation checked in the first step;
- a third step of calculating an appropriate inspection content when it is determined in the second step that the inspection content is not appropriate;
- a fourth step of presenting the appropriate inspection content calculated in the third step to a user along with base information indicating that the inspection content is appropriate;
- a fifth step of receiving an approval from the user for performing the inspection in accordance with the inspection content presented in the fourth step;
- a sixth step of setting the inspection content by the inspection apparatus to new inspection content when the approval is received from the user in the fifth step; and
- a seventh step of storing data of the new inspection content as history information along with setting-related information comprising a time at which at least the new inspection content is set when the new inspection content is set in the sixth step.

13. The inspection management system according to claim 2, further comprising:
- an inspection standard calculation unit configured to calculate an inspection standard more appropriate than a current inspection standard,
- wherein the inspection content data acquisition unit acquires the inspection standard calculated by the inspection standard calculation unit,
- wherein the setting-related information comprises base information indicating that the inspection standard calculated by the inspection standard calculation unit is appropriate, and
- wherein the output unit outputs the base information and the inspection standard calculated by the inspection standard calculation unit.

14. The inspection management system according to claim 2, further comprising:
- a new setting instruction unit configured to instruct the inspection apparatus to perform inspection in accordance with the inspection content set by the inspection content setting unit based on a command of a user and acquire feedback indicating whether the inspection apparatus accepts the instruction,
- wherein the setting-related information comprises information indicating that the instruction is given by the new setting instruction unit, indicating a time at which the instruction is given, and indicating a command by which the instruction is given, and information of the feedback.

15. The inspection management system according to claim 2, wherein the setting-related information comprises comparison data between an inspection achievement in accordance with the new inspection content set by the inspection content setting unit and an inspection achievement before the new inspection content is set.

16. The inspection management system according to claim 2, wherein a predetermined setting limit value is defined for the inspection content which is able to be set by the inspection content setting unit.

17. The inspection management system according to claim 2, wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process.

18. The inspection management system according to claim 8,
- wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process,
- wherein the inspection standard calculation unit calculates an inspection standard by which a first pass ratio which is an index related to detection of excessive defect in the intermediate inspection is higher than the current inspection standard, and
- wherein the base information comprises the first pass ratio which is an index related to detection of excessive defect in the intermediate inspection.

19. The inspection management system according to claim 8,
- wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process,
- wherein one or more pieces of inspection content comprising at least the final inspection in inspection are fixed, and the setting of the inspection content by the inspection content setting unit is performed on the intermediate inspection different from the inspection in which the inspection content is fixed.

20. The inspection management system according to claim 9,
- wherein the production line comprises a plurality of manufacturing apparatuses and inspection apparatuses corresponding to a plurality of processes, and the inspection comprises final inspection performed to inspect a completed product subjected to the plurality of processes and one or more intermediate inspections performed to inspect an intermediate product manufactured in the processes earlier than a final process,
- wherein one or more pieces of inspection content comprising at least the final inspection in inspection are fixed, and the setting of the inspection content by the inspection content setting unit is performed on the intermediate inspection different from the inspection in which the inspection content is fixed.

* * * * *